United States Patent [19]
Chien et al.

[11] Patent Number: 6,017,799
[45] Date of Patent: Jan. 25, 2000

[54] METHOD OF FABRICATING DYNAMIC RANDOM MEMORY

[75] Inventors: Sun-Chieh Chien; Peter Hsue; Der-Yuan Wu, all of Hsinchu, Taiwan

[73] Assignee: United Microelectronics Corp., Taipei, Taiwan

[21] Appl. No.: 09/040,553

[22] Filed: Mar. 18, 1998

[30] Foreign Application Priority Data

Dec. 20, 1997 [TW] Taiwan ................................. 86119412

[51] Int. Cl.[7] .................................................. H01L 21/336
[52] U.S. Cl. .......................................... 438/291; 438/298
[58] Field of Search ..................................... 438/291, 228, 438/220, 419, 289, 298

[56] References Cited

U.S. PATENT DOCUMENTS 5,594,264  1/1997  Shirahata et al. ....................... 257/335
5,693,505  12/1997  Kobayashi ............................... 438/217
5,939,762  8/1999  Lien ........................................ 257/391

Primary Examiner—Brian Dutton
Attorney, Agent, or Firm—Thomas, Kayden, Horstemeyer & Risley

[57] ABSTRACT

A method of fabricating a dynamic random memory. On a semiconductor substrate comprising a memory cell region and a periphery circuit region, a first field implantation and a first anti-punch through implantation are performed. Using a photo-resist layer formed to cover the memory cell region as a mask, the periphery circuit region is performed with a second field implantation and a second anti-punch through implantation.

22 Claims, 7 Drawing Sheets

METHOD OF FABRICATING DYNAMIC
RANDOM MEMORY

CROSS-REFERENCE TO RELATED APPLICATION

This application claims priority benefit of Taiwan application Serial no. 86119412, filed Dec. 20, 1997, the full disclosure of which is incorporated herein by reference.

BACKGROUND OF THE INVENTION

1. Field of the Invention

The invention relates to a method of fabricating a dynamic random memory (DRAM), and more particularly to a method of fabricating a DRAM by using field implantation and anti-punch through implantation.

2. Description of the Related Art

As the function of computer and electronic products becomes more and more advanced, the applied circuit grows more and more complex. Based on the consideration of fabrication cost and stability, the density of devices in every single integrated circuit (IC) is demanded greatly. However, to achieve a very high density of devices on an IC, in addition to the shrinkage of the device size, the layout has to be altered proportionally. Therefore, both the limitation of a design rule and the physical characteristics of devices are to be considered.

In a metal-oxide-semiconductor (MOS), the channel width is not reduced unlimitedly. When the channel width is reduced to a certain degree, a short channel effect and a punch through phenomenon occur. To overcome the short channel effect, a lightly doped drain (LDD) structure is adapted. To solve the problem of punch through, a punch through implantation is perform to obtain a higher punching through voltage.

Referring to FIG. 1A to FIG. 1D, a conventional method of fabricating a DRAM is shown. In FIG. 1A, on a semi-conductor substrate 100, for example, a P-type semiconductor, a pad oxide layer 102 is formed. A silicon nitride layer 104 is formed on the pad oxide layer 102, and a photo-resist layer 106 is formed on the silicon nitride layer 104.

In FIG. 1B, using photolithography and etching, the photo-resist layer 106 is patterned as 106a to defined an active region 142 on a memory cell region 140 and an active region and 152 on a periphery circuit region 150. Using the photo-resist layer 106a as a mask, the exposed silicon nitride layer 104 is removed to expose the pad oxide layer 102. The remaining silicon nitride layer 104a is shown as figure. Again, using the photo-resist layer 106a as a mask, field implanted regions 108 and 109 in the memory cell region 140 and the periphery circuit region 150 respectively are formed by field implantation or channel stop implantation 103. For example, the field implantation or channel stop implantation is performed with boron ions of about $6 \times 10^{12}$ ion/cm$^2$ at about 150 KeV.

In FIG. 1C, the photo-resist layer 160a is removed. The remaining silicon nitride layer 104a is used as a mask for thermal oxidation in an environment with mist. The exposed pad oxide layer 102 is transformed as a field oxide layer 112 by thermal oxidation. During thermal oxidation, the implanted ions are driven in the substrate 100 to enhance the device isolation effect.

Referring to FIG. 1D, the remaining silicon nitride layer 104a and the pad oxide layer 102 are removed. Hitherto, a local oxidation of silicon (LOCOS) is performed. A protective thin oxide layer 102a is formed on the active regions 142 and 152. Anti-punch through implanted region 118 and 119 are formed in the memory cell region 140 and the periphery circuit region 150 by anti-punch through ion implantation 105. The ion implantation 105 is performed, for example, with P-type boron ions of about $4 \times 10^{12}$ ion/cm$^2$ at about 150 KeV. The punch through voltage of a DRAM is increased by increasing the doping concentration under the channel.

In FIG. 1E, a transfer transistor 126, a capacitor 128, and a periphery circuit 130 are formed by a conventional method.

As the integration of a semiconductor devices increases, the design rule reduces. The above field implantation is performed with a shrinking linewidth. A narrow width effect happens due to field implantation, so that the threshold voltage is increased.

FIG. 2A to FIG. 2C shows another conventional method of fabricating a DRAM. Referring to FIG. 2A, on a semi-conductor substrate 200, for example, a P-type substrate, a field oxide layer 212 is formed to isolate device region. The field oxide layer 212 is formed, for example, by LOCOS. Simultaneously, channel stops 208 and 209 are formed in a predetermined memory cell region 240 and a predetermined periphery circuit region 250 respectively by field implantation 203. The field implantation is performed with boron ions of about $4 \times 10^{12}$ ion/cm$^2$ at about 70 KeV.

In FIG. 2C, a transfer transistor 226, a capacitor 228, and a periphery circuit 230 are formed by a conventional method.

The narrow channel effect in the process with reduced linewidth is prevented by the above method. However, according to design rule, the ion dosages of field implantation in the memory cell region and in the periphery circuit region are different. It is found that the ion dosages in the memory cell region and the periphery circuit region are the same by the above method. Using higher ion dosage of field implantation for the periphery circuit region, the potential difference of the source/drain region (junction area) of the field effect transistor in the memory cell region is increased. The electric field effect is enhanced, and a serious leakage current from the capacitor of the memory cell region occurs. The shortage of storage charges in the capacitor causes a shorter refresh time to ensure the correctness of data access. On the other hand, using lower ion dosage of field implantation for the memory cell region, a required concentration of in the field oxide region of the periphery circuit region cannot be obtained to achieve channel stop effect.

SUMMARY OF THE INVENTION

It is therefore an object of the invention to provide a method of fabricating a DRAM. The memory cell region and the periphery circuit region are implanted by field implantation and anti-punch through implantation to achieve the channel stop effect. The punch through voltage is then enhanced. In addition, the potential different in the junction area is lowered, the field effect is reduced, and the leakage current is decreased.

To achieve these objects and advantages, and in accordance with the purpose of the invention, as embodied and broadly described herein, the invention is directed towards a method of fabricating a DRAM. On a semiconductor substrate a semiconductor comprising a memory cell region and a periphery circuit region, a first field implantation and a first anti-punch through implantation are performed to the semiconductor substrate. A photo-resist layer is formed and patterned to cover the memory cell region. A second field implantation and a second anti-punch through implantation are performed to the exposed periphery circuit region. The photo-resist layer is removed. A dynamic random memory cell is formed on the memory cell region, and a periphery circuit is formed on the periphery circuit region.

To achieve these objects and advantages, and in accordance with the purpose of the invention, as embodied and broadly described herein, the invention is directed towards another method of fabricating a DRAM. On a semiconductor substrate comprising a memory cell region and a periphery circuit region, a first photo-resist layer is formed to cover the periphery circuit region. A first field implantation and a first anti-punch through implantation are performed to the exposed memory cell region by using the photo-resist layer as a mask. The first photo-resist layer is removed. A second photo-resist layer is formed and patterned to cover the memory cell region. A second field implantation and a second anti-punch through implantation are performed by using the second photo-resist layer as a mask. The second photo-resist layer is removed. A dynamic memory cell is formed on the memory cell region, and a periphery circuit is formed on the periphery circuit region.

It is to be understood that both the foregoing general description and the following detailed description are exemplary and explanatory only and are not restrictive of the invention, as claimed.

DESCRIPTION OF THE PREFERRED EMBODIMENTS

Figure 1A:
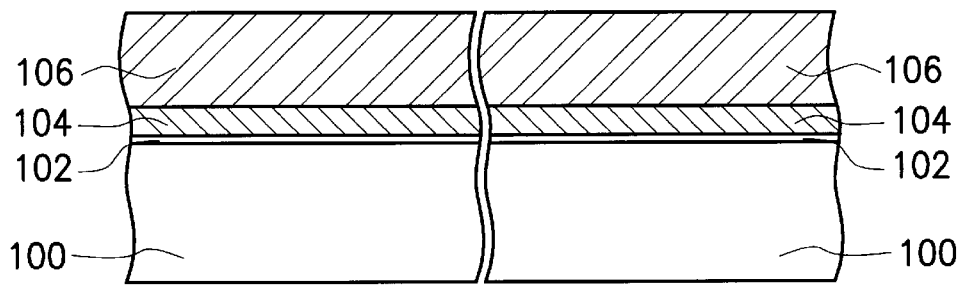
FIG. 1A to FIG. 1E are cross sectional views of a conventional process for fabricating a DRAM.
Figure 1B:
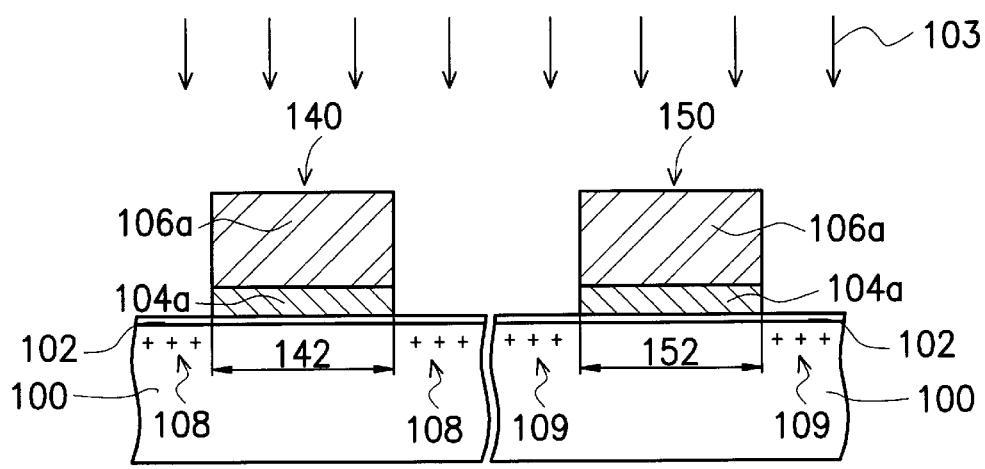
Figure 1C:
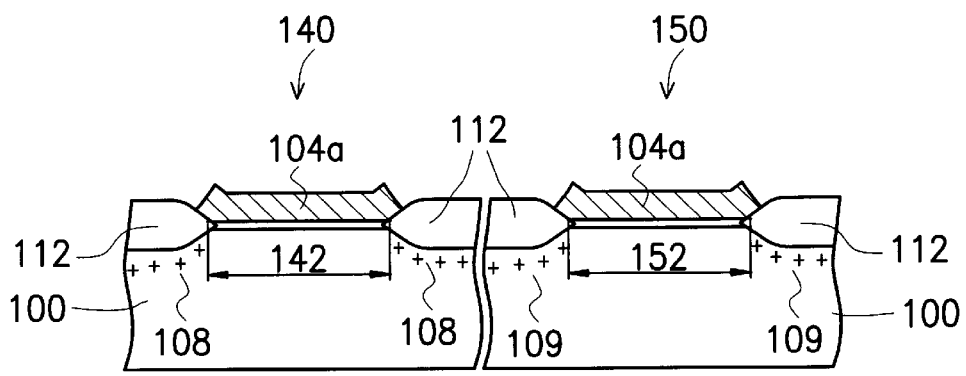
Figure 1D:
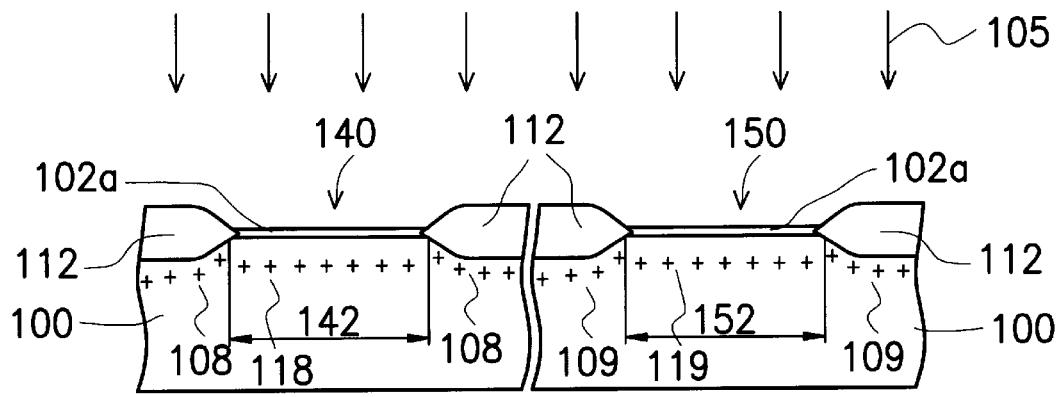
Figure 1E:
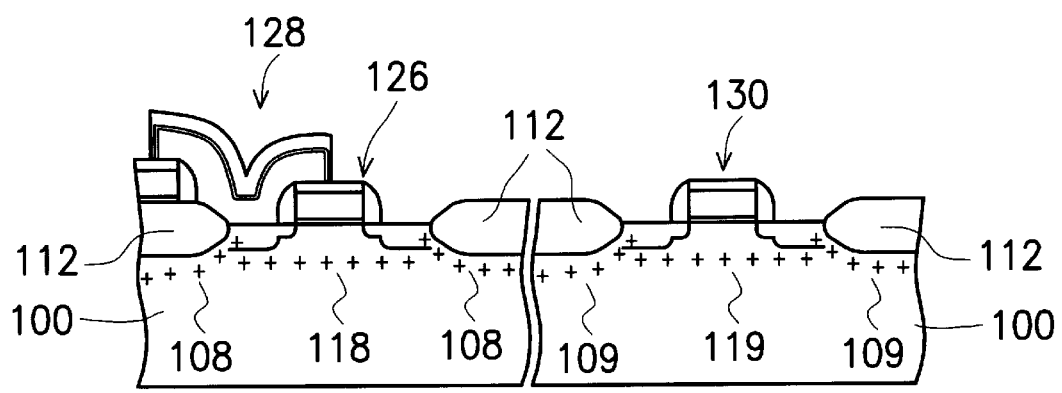
Figure 2A:
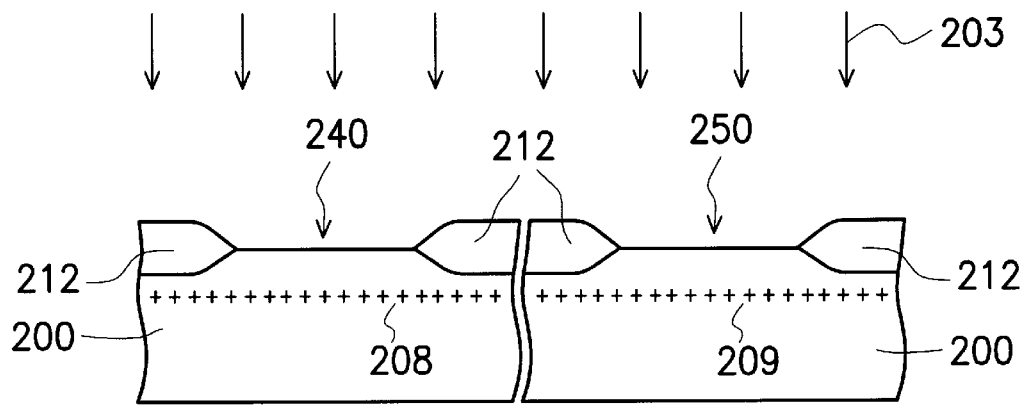
FIG. 2A to FIG. 2C are cross sectional views of another conventional process for fabricating a DRAM.
Figure 2B:
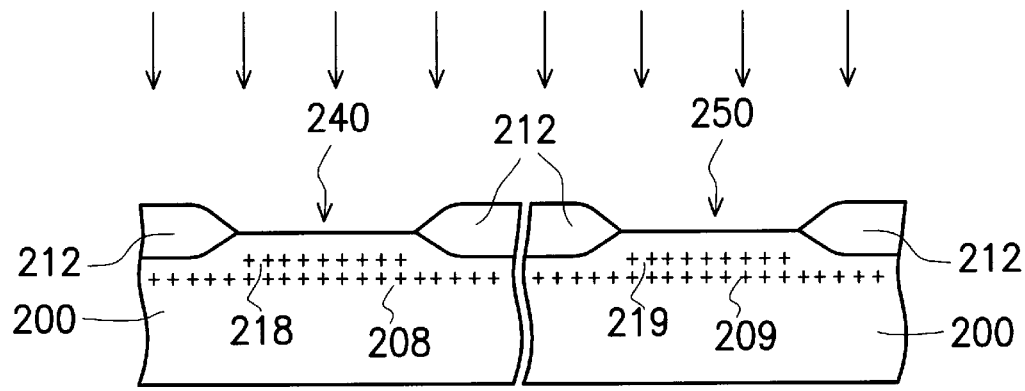
Figure 2C:
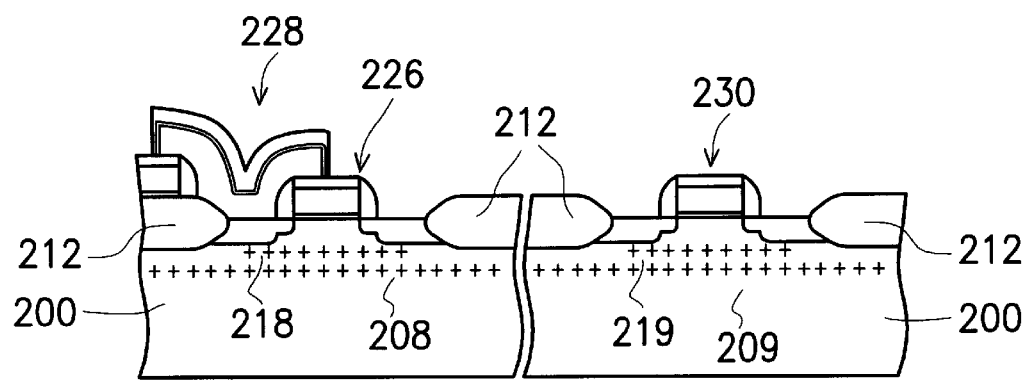
Figure 3A:
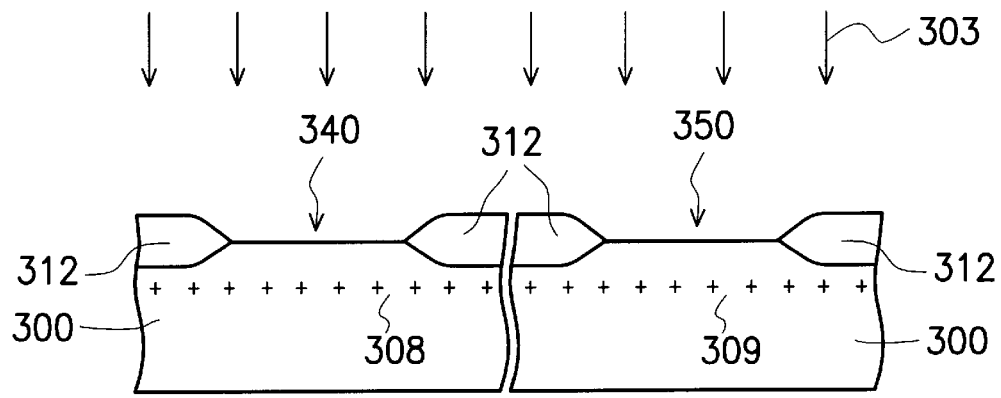
FIG. 3A to FIG. 3E are cross sectional views of the process for fabricating a capacitor in a DRAM in a preferred embodiment according to the invention.

In FIG. 3A, on a semiconductor substrate 300 such as a P-type substrate, a field oxide layer 302 is formed, for example, by LOCOS, to define device regions (not shown). The substrate 300 is implanted with a first ion 303 to form a memory cell region 340, a periphery circuit region 350, and channel stops 308 and 309. The first ion includes, for example, boron ions with a dosage of about $1 \times 10^{12}$ion/cm$^2$ to $4 \times 10^{12}$ion/cm$^2$ at an energy of about 150 KeV to 180 KeV.

Figure 3B:
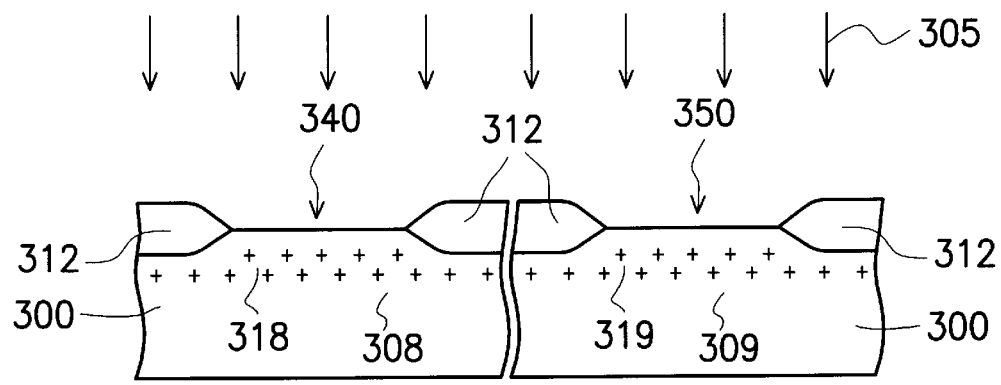

In FIG. 3B, a first anti-punch through ion implantation 305 is performed to form anti-punch through regions 318 and 319 in the memory cell region 340 and the periphery circuit region 350, respectively. The first anti-punch through ion implantation 305 is performed, for example, by boron ions with a dosage of about $1 \times 10^{12}$ion/cm$^2$ to $3 \times 10^{12}$ion/cm$^2$ at an energy of about 50 KeV to 70 KeV.

Figure 3C:
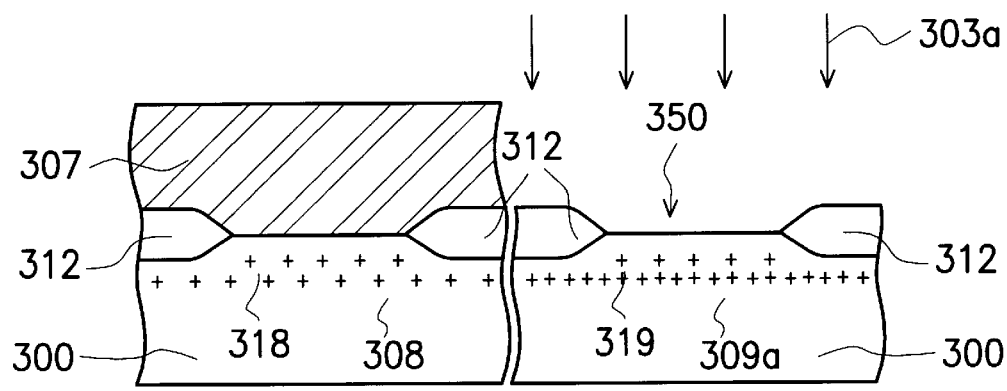

In FIG. 3C, a photo-resist layer 307 is formed and patterned to cover the memory cell region 340. The exposed periphery circuit region 350 is implanted with a second ion 303a to form an implanted region 309a with a higher implantation concentration. The second ion includes, for example, boron ions with a dosage of about $1 \times 10^{12}$ion/cm$^2$ to $4 \times 10^{12}$ion/cm$^2$ at an energy of about 150 KeV to 180 KeV.

Figure 3D:
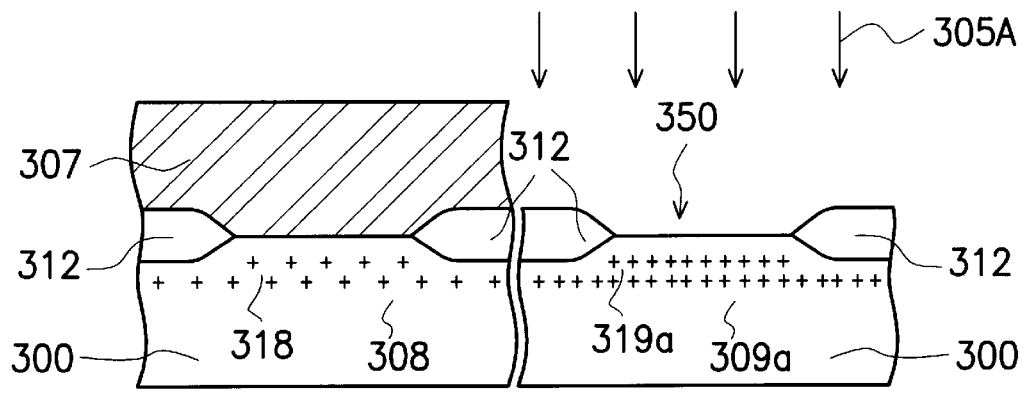

In FIG. 3D, the exposed periphery circuit region 350 is implanted with a second anti-punch through ion 305a to form an anti-punch through region 319a with a higher ion concentration. The second anti-punch through ion includes, for example, boron ions with a dosage of about $1 \times 10^{12}$ion/cm$^2$ to $3 \times 10^{12}$ion/cm$^2$ at an energy of about 50 KeV 70 KeV.

Figure 3E:
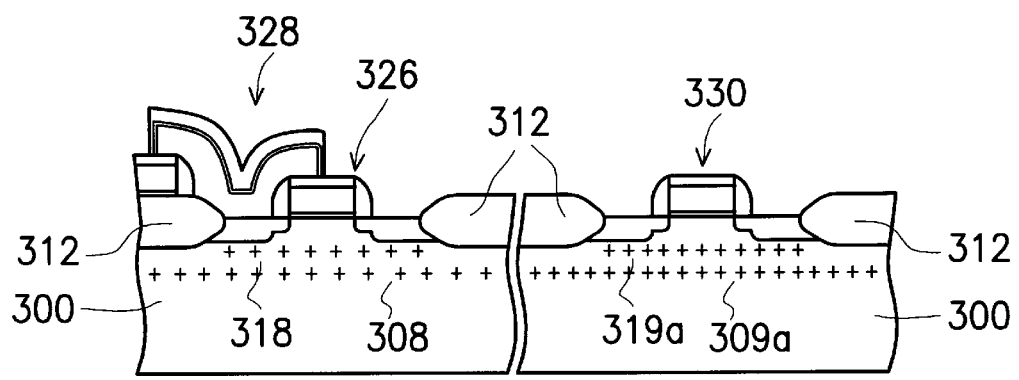

In FIG. 3E, the photo-resist layer 307 is removed. Using a conventional method, a dynamic random memory cell comprising a transfer transistor 326 and a capacitor 328 are formed in the memory cell region 340, and a periphery circuit 330 is formed in the periphery circuit region 350.

Referring to FIG. 4A to FIG. 4E, another embodiment of fabricating a DRAM by using a mask for field implantation is shown.

Figure 4A:
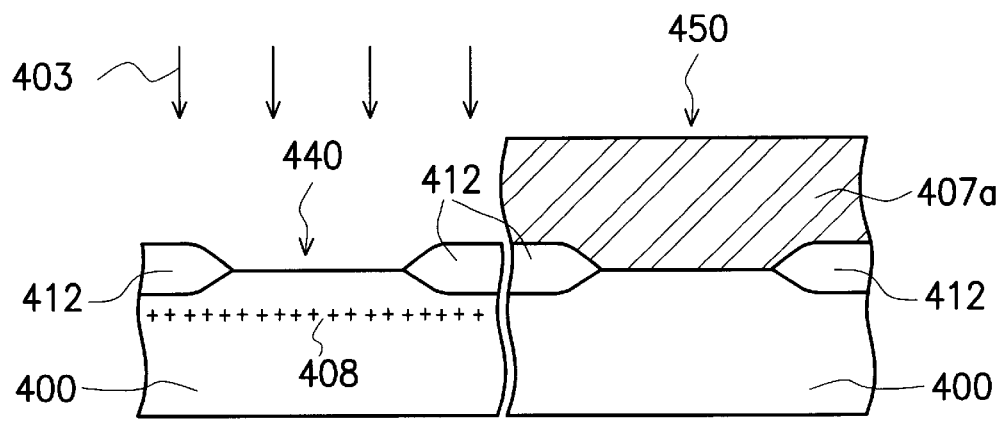
FIG. 4A to FIG. 4E are cross sectional views of the process for fabricating a capacitor in a DRAM in another preferred embodiment according to the invention.
Figure 4B:
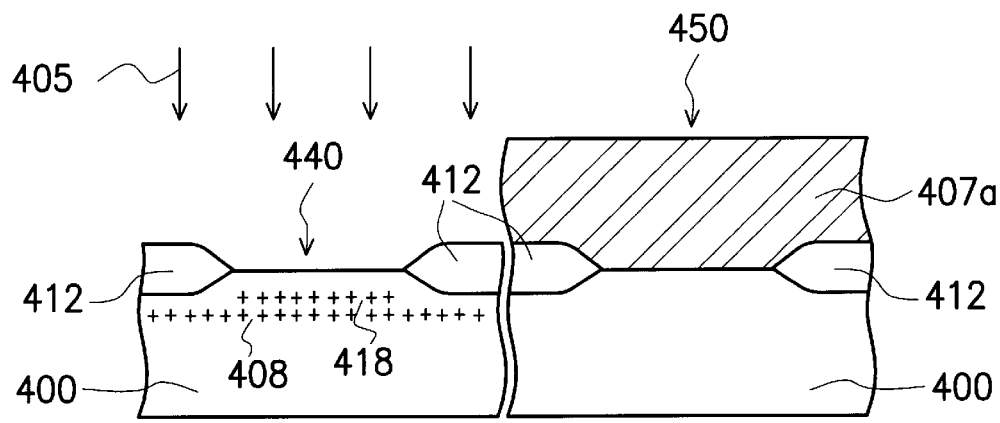

In FIG. 4A, on a semiconductor substrate 400 such as a P-type substrate, a field oxide layer is formed, for example, by LOCOS, to define device regions (not shown). A photo-resist layer 407a is formed and patterned to cover a periphery circuit region 450. The exposed substrate 400, that is, a memory cell region 440 uncovered by the photo-resist layer 407a, is implanted by field implantation with a first ion 403 to form a channel stop 408. The first ion includes, for example, boron ions with a dosage of about $1 \times 10^{12}$ion/cm$^2$ to $4 \times 10^{12}$ion/cm$^2$ at an energy of about 150 KeV to 180 KeV In FIG. 4B, using the photo-resist layer as a mask, a first anti-punch through implantation 405 is performed to form an anti-punch through region 418 in the memory cell region 440. The first anti-punch through implantation 405 is performed with, for example, boron ions with a dosage of about $1 \times 10^{12}$ion/cm$^2$ to $3 \times 10^{12}$ion/cm$^2$ at an energy of about 50 KeV to 70 KeV.

Figure 4C:
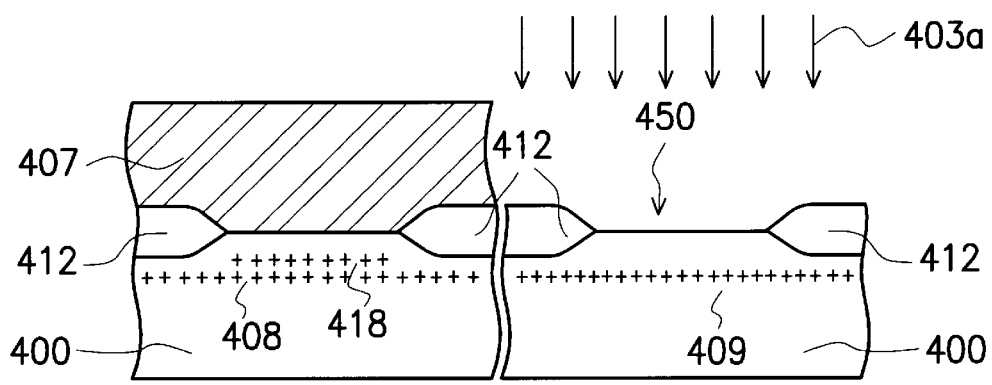

In FIG. 4C, the photo-resist layer 407a is removed. A photo-resist layer 407 is formed and patterned to cover the memory cell region 440. The exposed periphery circuit region 450 is implanted with a second ion 403a to form an implanted region 409. The second ion 403a includes, for example, boron ions with a dosage of about $6 \times 10^{12}$ion/cm$^2$ at an energy of about 150 KeV to 180 KeV.

Figure 4D:
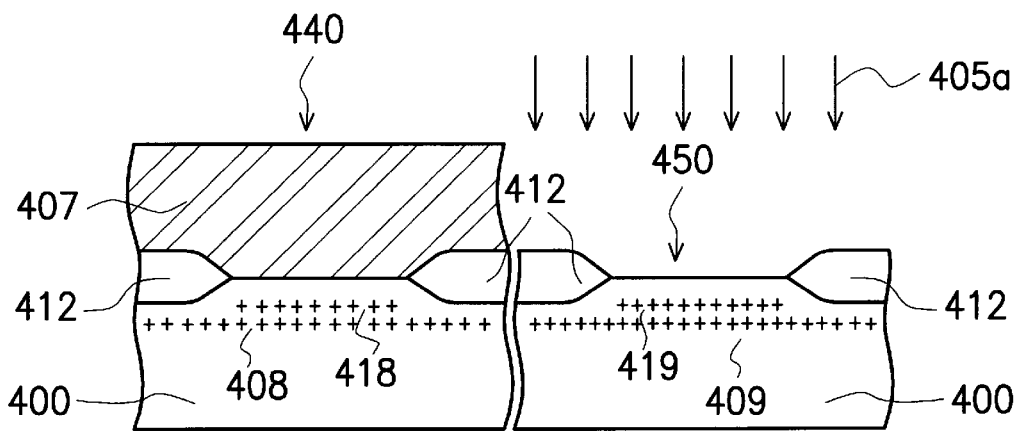

In FIG. 4D, the exposed periphery circuit region 450 is implanted with a second anti-punch through ion 405a to form an anti-punch through region 419. The second anti-punch through ion 405a includes, for example, boron ions with a dosage of about $4 \times 10^{12}$ion/cm$^2$ at an energy of about 50 KeV to 70 KeV.

Figure 4E:
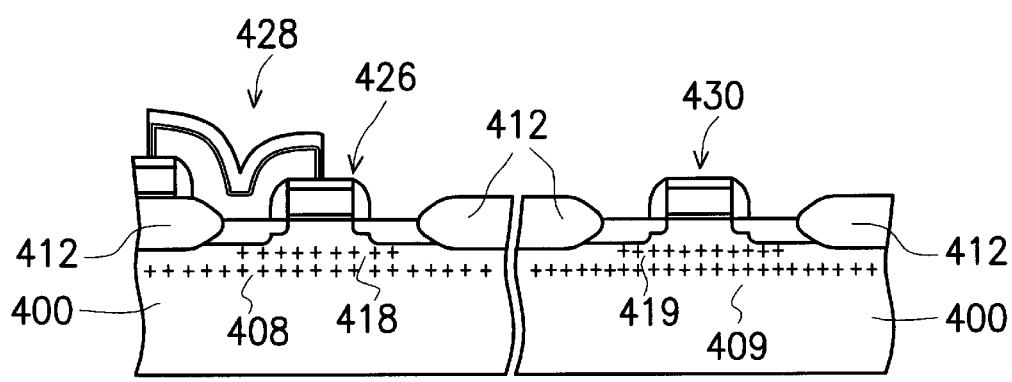

In FIG. 4E, the photo-resist layer 407 is removed. Using a conventional method, a dynamic random memory cell comprising a transfer transistor 426 and a capacitor 428 are formed in the memory cell region 440, and a periphery circuit 430 is formed in the periphery circuit region 450.

The first characteristic of the invention is that, as described in the first embodiment, a first field implantation and a first anti-punch through implantation are performed simultaneously. Using a photo-resist layer to cover the memory cell region, a second field implantation and the second anti-punch through implantation are performed with a higher dosage than the first implantation towards the periphery circuit region. The implantation concentration in both the memory cell region and the periphery circuit region thus meet the requirement of the design rule. The disadvantage in the conventional method that the implantation concentration of the memory cell region and the periphery circuit region cannot be controlled as required is overcome in the invention. A longer refresh time is obtained.

The second characteristic of the invention is that, as described in the second embodiment, a photo-resist layer is formed and patterned to cover the periphery circuit region, so that are field implantation and an anti-punch through implantation are performed towards the memory cell region with a lower implantation concentration. The photo-resist layer is removed, and another photo-resist layer is formed and patterned to cover the memory cell region. Using the photo-resist layer as a mask, the periphery circuit region is implanted by field implantation and anti-punch through implantation with a higher implantation concentration. The implantation concentration in both the memory cell region and the periphery circuit region thus meet the requirement of the design rule. The disadvantage in the conventional method that the implantation concentration of the memory cell region and the periphery circuit region cannot be controlled as required is overcome in the invention. A longer refresh time is obtained.

The third characteristic of the invention is that an average breakdown charge with a higher Qbd and a lower conductivity are obtained. In the second conventional method, by performing field implantation with a dosage of about $6 \times 10^{12}$ion/cm$^2$ and anti-punch through implantation with a dosage of $3.5 \times 10^{12}$ion/cm$^2$ towards the memory cell region and the periphery circuit region simultaneously, an average breakdown charge with a Qbd of about 1.8 coul/cm$^2$ and a conductivity of about 6.16 are obtained. In the invention, by performing field implantation with a dosage of about $4 \times 10^{12}$ion/cm$^2$ and $6 \times 10^{12}$ion/cm$^2$ towards the memory cell region and the periphery circuit region respectively, and by performing anti-punch through implantation with a dosage of about $3.5 \times 10^{12}$ion/cm$^2$ and $2 \times 10^{12}$ion/cm$^2$ towards the memory cell region and the periphery circuit region respectively, an average breakdown charge with a Qbd of about 17.6 coul/cm$^2$ and a conductivity of about 1.617 are obtained. The Qbd is about 9.8 times enhanced, and the conductive is about 3.7 times decreased, and therefore, the device characteristic is improved.

The fourth characteristic of the invention is that the refresh time is increased. By increasing the dosage of field implantation from $6 \times 10^{12}$ion/cm$^2$ to $4 \times 10^{12}$ion/cm$^2$ at about 150 KeV, a period of about 50 msec of the refresh time is increased. In addition, if the anti-punch through implantation is increased from $3.5 \times 10^{12}$ion/cm$^2$ to $2 \times 10^{12}$ion/cm$^2$ at about 70 KeV, a period of about 50 msec of the refresh time is increased. Therefore, the leakage current is reduced, and the refresh time is increased in the invention.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a dynamic random memory, wherein a semiconductor comprising a memory cell region and a periphery circuit region is provided, comprising:
   performing a first field implantation and a first anti-punch through implantation to the semiconductor substrate;
   forming and patterning a photo-resist layer to cover the memory cell region;
   performing a second field implantation and a second anti-punch through implantation to the exposed periphery circuit region;
   removing the photo-resist layer; and
   forming a dynamic random memory cell on the memory cell region, and a periphery circuit on the periphery circuit region.

2. The method according to claim 1, wherein the first field implantation is performed with a dosage less than the second field implantation.

3. The method according to claim 1, wherein the first field implantation is performed with boron ions.

4. The method according to claim 3, wherein first the field implantation is performed with a dosage of about $1 \times 10^{12}$ion/cm$^2$ to $4 \times 10^{12}$ion/cm$^2$ at an energy of about 150 KeV to 180 KeV.

5. The method according to claim 1, wherein the second field implantation is performed with boron ions.

6. The method according to claim 1, wherein the second field implantation is performed with a dosage of about $1 \times 10^{12}$ion/cm$^2$ to $4 \times 10^{12}$ion/cm$^2$ at an energy of about 150 KeV to 180 KeV.

7. The method according to claim 1, wherein the first anti-punch through implantation is performed with a dosage less than the second anti-punch through implantation.

8. The method according to claim 1, wherein the first anti-punch through implantation is performed with boron ions.

9. The method according to claim 8, wherein the first anti-punch through implantation is performed with a dosage of about $1 \times 10^{12}$ion/cm$^2$ to $3 \times 10^{12}$ion/cm$^2$ at an energy of about 50 KeV to 70 KeV.

10. The method according to claim 1, wherein the second anti-punch through implantation is performed with boron ions.

11. The method according to claim 10, wherein the first anti-punch through implantation is performed with a dosage of about $1 \times 10^{12}$ion/cm$^2$ to $3 \times 10^{12}$ion/cm$^2$ at an energy of about 70 KeV.

12. A method of fabricating, a dynamic random memory, wherein a semiconductor substrate comprising a memory cell region and a periphery circuit region is provided, comprising:
   forming and patterning a first photo-resist layer to cover the periphery circuit region;
   performing a first field implantation and a first anti-punch through implantation to the exposed memory cell region by using the photo-resist layer as a mask;
   removing the first photo-resist layer;
   forming and patterning a second photo-resist layer to cover the memory cell region;
   performing a second field implantation and a second anti-punch through implantation by using the second photo-resist layer as a mask;
   removing the second photo-resist layer; and
   forming a dynamic memory cell on the memory cell region and a periphery circuit on the periphery circuit region.

13. The method according to claim 12, wherein the first field implantation is performed with a dosage less than the second field implantation.

14. The method according to claim 12, wherein the first field implantation is performed with boron ions.

15. The method according to claim 14, wherein first the field implantation is performed with a dosage of about $1 \times 10^{12}$ion/cm$^2$ to $3 \times 10^{12}$ion/cm$^2$ at an energy of about 150 KeV to 180 KeV.

16. The method according to claim 12, wherein the second field implantation is performed with boron ions.

17. The method according to claim 12, wherein the second field implantation is performed with a dosage of about $6 \times 10^{12}$ion/cm$^2$ at an energy of about 150 KeV to 180 KeV.

18. The method according to claim 12, wherein the first anti-punch through implantation is performed with a dosage less than the second anti-punch through implantation.

19. The method according to claim 12, wherein the first anti-punch through implantation is performed with boron ions.

20. The method according to claim 19, wherein the first anti-punch through implantation is performed with a dosage of about $1 \times 10^{12}$ ion/cm$^2$ to $3 \times 10^{12}$ ion/cm$^2$ at an energy of about 50 KeV to 70 KeV.

21. The method according to claim 12, wherein the second anti-punch through implantation is performed with boron ions.

22. The method according to claim 21, wherein the first anti-punch through implantation is performed with a dosage of about $4 \times 10^{12}$ ion/cm$^2$ at an energy of about 50 KeV to 70 KeV.

* * * * *